(12) United States Patent
Koffler et al.

(10) Patent No.: US 6,297,087 B1
(45) Date of Patent: Oct. 2, 2001

(54) PROCESS FOR DRAM CELL PRODUCTION

(75) Inventors: Guenther Koffler, Villach (AT); Siegfried Mischitz, Regensburg (DE)

(73) Assignee: Siemens PLC, Berkshire (GB)

( * ) Notice: Subject to any disclaimer, the term of this patent is extended or adjusted under 35 U.S.C. 154(b) by 0 days.

(21) Appl. No.: 09/393,700

(22) Filed: Sep. 10, 1999

(30) Foreign Application Priority Data

Sep. 11, 1998 (GB) .................................................. 9819695

(51) Int. Cl.$^7$ .............................................. H01L 21/8242

(52) U.S. Cl. .......................... 438/243; 438/245; 438/246; 438/700

(58) Field of Search ..................... 438/243, 244, 438/246, 265, 245, 700

(56) References Cited

U.S. PATENT DOCUMENTS 4,824,793 * 4/1989 Richardson ......................... 438/265
5,677,219 * 10/1997 Mazure' et al. ..................... 438/243

OTHER PUBLICATIONS

Ssato et al., "Transistor on Capacitor (TOC) Cell with Quarter Pitch Layout for DRAM", IEEE,ED 45, pp. 82,83, 1998.*

* cited by examiner

*Primary Examiner*—Charles Bowers
*Assistant Examiner*—Yennhu B. Huynh
(74) *Attorney, Agent, or Firm*—Crowell & Moring LLP

(57) ABSTRACT

A process for DRAM cell production includes (1) depositing a layer of a first substance in a trench; (2) depositing a first layer of a second substance in said trench; (3) growing an interfacial layer of oxide between said layer of said first substance and said first layer of said second substance, and between side walls of said trench and said first layer of said second substance; (4) applying an anisotropic etching substance to the surface of said first layer of said second substance, thereby exposing said interfacial layer of oxide; (5) applying a second etching substance to the surface of said first layer of said second substance thereby substantially removing said interfacial layer of oxide; and (6) depositing a second layer of said second substance in said trench. The process reduces the contact resistance of the buried strap and improves the production yield for low temperature performance cells.

11 Claims, 1 Drawing Sheet

PROCESS FOR DRAM CELL PRODUCTION

BACKGROUND AND SUMMARY OF INVENTION

According to the present invention there is provided a process for DRAM cell production comprising the steps of (1) depositing a layer of a first substance in a trench, (2) depositing a first layer of a second substance in said trench, (3) growing an interfacial layer of oxide (a) between said layer of said first substance and said first layer of said second substance, and (b) between side walls of said trench and said first layer of said second substance, (4) applying an anisotropic etching substance to the surface of said first layer of said second substance, thereby protecting said interfacial layer of oxide between said side walls of said trench and said first layer of said second substance and exposing said interfacial layer of oxide disposed on top of said layer of said first substance, (5) applying a second etching substance, thereby substantially removing said interfacial layer of oxide disposed on top of said layer of said first substance, and (6) depositing a second layer of said second substance in said trench in a manner which substantially fills said trench. However, the presence of the interfacial layer of oxide also resulted in an unwanted increase in the contact resistance of the buried strap causing a production yield loss in low temperature performance cells.

The present invention solves the technical problem of reducing the contact resistance of the buried strap and thus improving the production yield for low temperature performance cells.

According to the present invention there is provided a process for DRAM cell production comprising the step of depositing a layer of a first substance in a trench, characterised in that said process further comprises the steps of depositing a first layer of a second substance in said trench, growing an interfacial layer of oxide between said layer of said first substance and said first layer of said second substance, and between side walls of said trench and said first layer of said second substance, applying an anisotropic etching substance to the surface of said first layer of said second substance, thereby protecting said interfacial layer of oxide between said side walls of said trench and said first layer of said second substance and exposing said interfacial layer of oxide and said first layer of said second substance disposed on top of said layer of said first substance, applying a second etching substance to the surface of said first layer of said second substance, thereby substantially removing said interfacial layer of oxide and said first layer of said second substance disposed on top of said layer of said first substance, and depositing a second layer of said second substance in said trench in a manner which substantially fills said trench.

Said layer of said first substance may be approximately 300 nm thick and said first substance may be arsenic doped phosphorous silicon.

Said first layer of said second substance may be approximately 50 nm thick and said second substance may be silicon.

Said interfacial layer of oxide may be approximately 2 nm thick.

Said second layer of said second substance may be approximately 250 nm thick.

Said anisotropic etching substance may be a substance comprising hydrochloric acid, chlorine, and helium oxide ($HCL$, $CL_2$, $He/O_2$).

Said second etching substance may be hydrofluoric acid (HF).

As will be appreciated by those skilled in the art various types of silicon may be used such as arsenic doped boron silicon and the thickness of the layers may be varied. Furthermore, as will be appreciated, other types of etching substances may be used in this process, such as hydrofluoric acid containing vapour.

The present invention provides an improvement to existing DRAM production processes by maintaining protection against dislocation through the use of an interfacial layer of oxide on the side walls of the trenches, while reducing the unwanted contact resistance caused by the presence of the interfacial layer of oxide between the two layers of silicon. By reducing the contact resistance the DRAM cell is less prone to failure during low temperature operation. Thus the present invention provides a higher production yield for low temperature performance cells.

BRIEF DESCRIPTION OF THE DRAWINGS

While the principle advantages and features of the invention have been described above, a greater understanding and appreciation of the invention may be obtained by referring to the following drawings and detailed description of a preferred embodiment, presented by way of example only, in which.

DETAILED DESCRIPTION OF THE DRAWINGS

Figure 1:
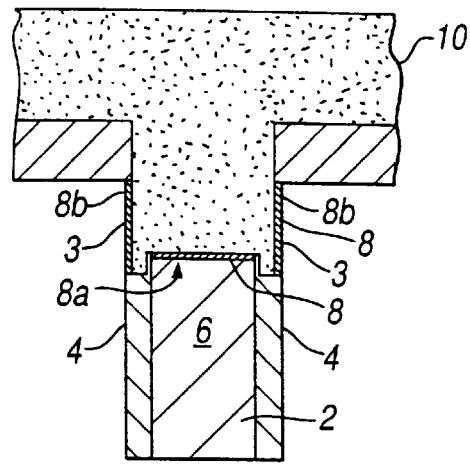
FIG. 1 is a diagram of the current DRAM production process.

In FIG. 1, the current DRAM production process is shown, in which a trench 2 is defined by a collar 4. A layer of arsenic doped phosphorous silicon 6, approximately 300 nm thick, is deposited by deposition means which are well known in the art. An interfacial layer of oxide 8 approximately 2 nm thick is grown on top of arsenic doped phosphorous silicon layer 6 and on the side walls 3 of the trench 2. A second layer of silicon 10 is deposited inside the trench by deposition means. The interfacial layer of oxide 8b on the side walls 3 acts as a barrier against dislocation. The interfacial layer of oxide 8a located between arsenic doped phosphorous silicon layer 6 and silicon layer 10 serves to increase the contact resistance between the layers 6 and 10.

Figure 2A:
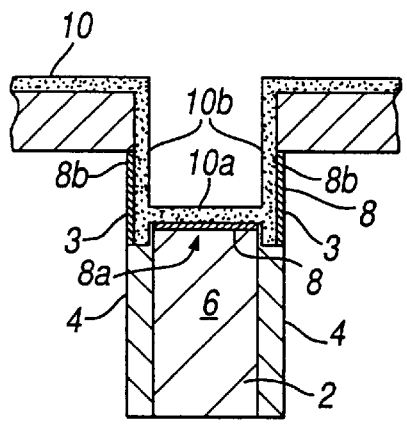
FIGS. 2a, 2b and 2c are diagrams of the improved DRAM production process according to the present invention.

In FIG. 2a, where parts also appearing in FIG. 1 bear identical numeral designation, the improved DRAM production process according to the present invention is shown. The process according to the present invention differs from the known process in that the deposition of silicon layer 10 is stopped after approximately 50 nm have been deposited. The interfacial layer of oxide 8 is allowed to grow to a thickness of approximately 2 nm. An anisotropic etch is then applied inside the trench 2 whereby the poly crystal silicon 10b and interfacial layer of oxide 8b on the side walls 3 of the trench 2 are protected, however the silicon 10a and interfacial layer of oxide 8a on top of arsenic doped phosphorous silicon 6 are exposed. A second chemical etch is applied which substantially removes the interfacial layer of oxide 8a from the top of arsenic doped phosphorous silicon 6.

Figure 2B:
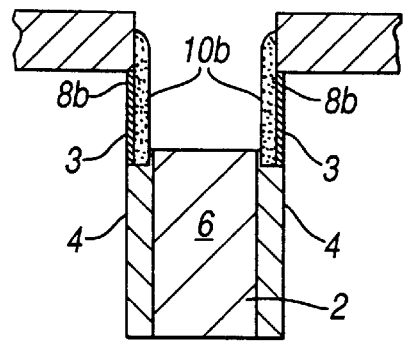

FIG. 2b, where parts also appearing in FIG. 2a bear identical numeral designation, shows arsenic doped phosphorous silicon 6 with the silicon 10a and the interfacial layer of oxide 8a removed from its surface. A second layer of silicon 10 is then deposited to fill trench 2.

Figure 2C:
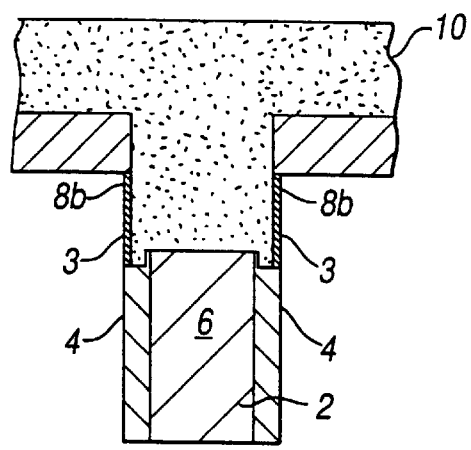

FIG. 2c, where parts also appearing in FIG. 2b bear identical numeral designation, shows the buried trench 2 filled with a layer of arsenic doped phosphorous silicon 6 and a layer of silicon 10 with the interfacial layer of oxide 8a removed from between layers 6 and 10, and the interfacial layer of oxide 8b still present on the sides walls 3 of the trench.

As will be appreciated by those skilled in the art, various modifications may be made to the embodiment hereinbefore described without departing from the scope of the present invention.

What is claimed is:

1. A process for DRAM cell production, comprising:
   depositing a layer of a first substance in a trench,
   depositing a first layer of a second substance in said trench,
   growing an interfacial layer of oxide between said layer of said first substance and said first layer of said second substance,
   growing an interfacial layer of oxide between side walls of said trench and said first layer of said second substance,
   applying an anisotropic etching substance to the surface of said first layer of said second substance, thereby protecting said interfacial layer of oxide between said side walls of said trench and said first layer of said second substance and exposing said interfacial layer of oxide disposed on top of said layer of said first substance,
   applying a second etching substance, thereby substantially removing said interfacial layer of oxide disposed on top of said layer of said first substance, and
   depositing a second layer of said second substance that substantially fills said trench.

2. A process as claimed in claim 1, wherein said layer of said first substance is approximately 300 mn thick.

3. A process as claimed in claim 1, wherein said first substance is arsenic doped silicon.

4. A process as claimed in any preceding claim, wherein said first layer of said second substance is approximately 50 nm thick.

5. A process as claimed in claim 1, wherein said second substance is silicon.

6. A process as claimed in claim 1, wherein said interfacial layer of oxide is approximately 2 nm thick.

7. A process as claimed in claim 1, wherein said second layer of said second substance is approximately 250 nm thick.

8. A process as claimed in claim 1, wherein said anisotropic etching substance is a substance selected from the group consisting of hydrochloric acid, chlorine, and helium oxide.

9. A process as claimed in claim 1, wherein said second etching substance is hydrofluoric acid (HF).

10. A process for DRAM cell production, comprising:
    depositing a layer of a doped silicon in a trench;
    depositing a first layer of silicon in said trench;
    growing an interfacial oxide layer between said layer of doped silicon and said first layer of silicon;
    growing an interfacial oxide layer between side walls of said trench and said first layer of silicon;
    applying an anisotropic etching substance to a surface of said first layer of silicon, thereby protecting said interfacial oxide layer between said side walls of said trench and said first layer of silicon and exposing said interfacial oxide layer on top of said layer of doped silicon;
    applying a second etching substance, thereby substantially removing said interfacial oxide layer on top of said layer of doped silicon; and
    depositing a second layer of silicon in said trench that substantially fills said trench.

11. A process for DRAM cell production, consisting of:
    depositing a layer of a first substance in a trench,
    depositing a first layer of a second substance in said trench,
    growing an interfacial layer of oxide between said layer of said first substance and said first layer of said second substance,
    growing an interfacial layer of oxide between side walls of said trench and said first layer of said second substance,
    applying an anisotropic etching substance to the surface of said first layer of said second substance, thereby protecting said interfacial layer of oxide between said side walls of said trench and said first layer of said second substance and exposing said interfacial layer of oxide disposed on top of said layer of said first substance,
    applying a second etching substance, thereby substantially removing said interfacial layer of oxide disposed on top of said layer of said first substance, and
    depositing a second layer of said second substance that substantially fills said trench.

* * * * *